(12) United States Patent
Lotfi et al.

(10) Patent No.: US 6,541,819 B2
(45) Date of Patent: Apr. 1, 2003

(54) SEMICONDUCTOR DEVICE HAVING NON-POWER ENHANCED AND POWER ENHANCED METAL OXIDE SEMICONDUCTOR DEVICES AND A METHOD OF MANUFACTURE THEREFOR

(75) Inventors: Ashraf W. Lotfi, Bridgewater, NJ (US); Jian Tan, Bridgewater, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/865,124

(22) Filed: May 24, 2001

(65) Prior Publication Data

US 2002/0175366 A1 Nov. 28, 2002

(51) Int. Cl.[7] ............................................... H01L 29/76
(52) U.S. Cl. ...................... 257/335; 257/266; 257/337; 257/341
(58) Field of Search ................................ 257/335, 337, 257/341, 266; 438/197, 199

(56) References Cited

U.S. PATENT DOCUMENTS

| 5,726,477 A | 3/1998 | Williams |
| 5,852,314 A | 12/1998 | Depetro |
| 5,917,222 A | 6/1999 | Smayling |
| 6,258,644 B1 * | 7/2001 | Rodder et al. ............... 438/199 |
| 6,277,682 B1 * | 8/2001 | Misium ....................... 438/199 |

OTHER PUBLICATIONS

US 6,104,076, 8/2000, Nakayama (withdrawn)

* cited by examiner

Primary Examiner—Vu A. Le
Assistant Examiner—Doug Menz

(57) ABSTRACT

The present invention provides a semiconductor device and a method of manufacture therefor. The semiconductor device includes a non-power enhanced metal oxide semiconductor (non-PEMOS) device having first source/drain regions located in a semiconductor substrate, wherein the first source/drain regions include a first dopant profile. The semiconductor device further includes a power enhanced metal oxide semiconductor (PEMOS) device located adjacent the non-PEMOS device and having second source/drain regions located in the semiconductor substrate, wherein the second source/drain regions include the first dopant profile.

9 Claims, 14 Drawing Sheets

SEMICONDUCTOR DEVICE HAVING NON-POWER ENHANCED AND POWER ENHANCED METAL OXIDE SEMICONDUCTOR DEVICES AND A METHOD OF MANUFACTURE THEREFOR

TECHNICAL FIELD OF THE INVENTION

The present invention is directed, in general, to integrated circuits and, more specifically, to a semiconductor device having a non-power enhanced metal oxide semiconductor (non-PEMOS) devices and power enhanced metal oxide semiconductor (PEMOS) devices, and a method of manufacture therefor.

BACKGROUND OF THE INVENTION

Complementary metal oxide semiconductor (CMOS) devices are commonly used and well known in the microelectronics industry. Such CMOS devices are generally used as logic devices, memory devices, or other similar devices. In addition to CMOS devices, laterally diffused metal oxide semiconductor (LDMOS) devices are also commonly used and well known in the microelectronics industry. LDMOS devices are generally used in an area of microelectronics called power management. Power management refers to a collection of circuits used to control the delivery of power to a particular device, such as a microprocessor, optical device, micro-electro-mechanical system (MEMS) device or another device.

There is currently a desire in the microelectronics industry to integrate conventional CMOS devices and LDMOS devices on a single semiconductor substrate. An example of a conventional integrated circuit 100 having both CMOS devices 120 and LDMOS devices 150 on a single semiconductor substrate 110, is illustrated in FIG. 1. It should be noted that due to the stringent requirements in constructing the CMOS devices 120 and the LDMOS devices 150, manufacturing the integrated circuit 100 may be complicated. For instance, the CMOS devices 120 and LDMOS devices 150 have different requirements associated with the dopant depths and concentrations in the respective CMOS wells 130 and LDMOS wells 160. There are also differences between CMOS and LDMOS heavily doped source/drain regions 135, 165, and the CMOS and LDMOS lightly doped source/drain regions 140, 170 of the corresponding CMOS and LDMOS devices 120, 150, which further exacerbate the difficulties in constructing the integrated circuit 100.

In view of the manufacturing complications associated with integrating both the CMOS devices and LDMOS devices 120, 150, on a single semiconductor substrate, the microelectronics industry currently manufactures the devices using completely separate processing steps. For example, the CMOS devices 120 are generally formed on the semiconductor substrate 110 and subsequently masked off, followed by the formation of the LDMOS devices 150, or vice versa if desired. Using completely separate manufacturing steps to produce the CMOS devices 120 and LDMOS devices 150 substantially achieves the end result, however, at a sacrifice. It currently requires up to an additional 15 steps to produce the LDMOS devices 150 over the number of steps to manufacture the CMOS devices 120. As a result, manufacturing time and cost increases, which one skilled in the art generally knows is undesirable.

Accordingly, what is needed in the art is a semiconductor device including devices employable for power management and other devices (e.g., CMOS devices) on the same semiconductor substrate, and a method of manufacture therefor, that does not experience difficulties associated with the prior art, such as the high manufacturing time and costs associated with the prior art devices.

SUMMARY OF THE INVENTION

To address the above-discussed deficiencies of the prior art, the present invention provides a semiconductor device. The semiconductor device includes a non-power enhanced metal oxide semiconductor (non-PEMOS) device, such as a complementary metal oxide semiconductor (CMOS) device, having first source/drain regions located in a semiconductor substrate, wherein the first source/drain regions include a first dopant profile. The semiconductor device further includes a power enhanced metal oxide semiconductor (PEMOS) device, such as a laterally diffused metal oxide semiconductor (LDMOS) device, located adjacent the non-PEMOS device and having second source/drain regions located in the semiconductor substrate, wherein the second source/drain regions include the first dopant profile.

Provided in another aspect of the invention is a method of manufacturing a semiconductor device. The method includes forming a non-PEMOS device over a semiconductor substrate using a predetermined number of steps, and simultaneously creating at least a portion of a PEMOS device over the semiconductor substrate using at least one of the predetermined number of steps.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
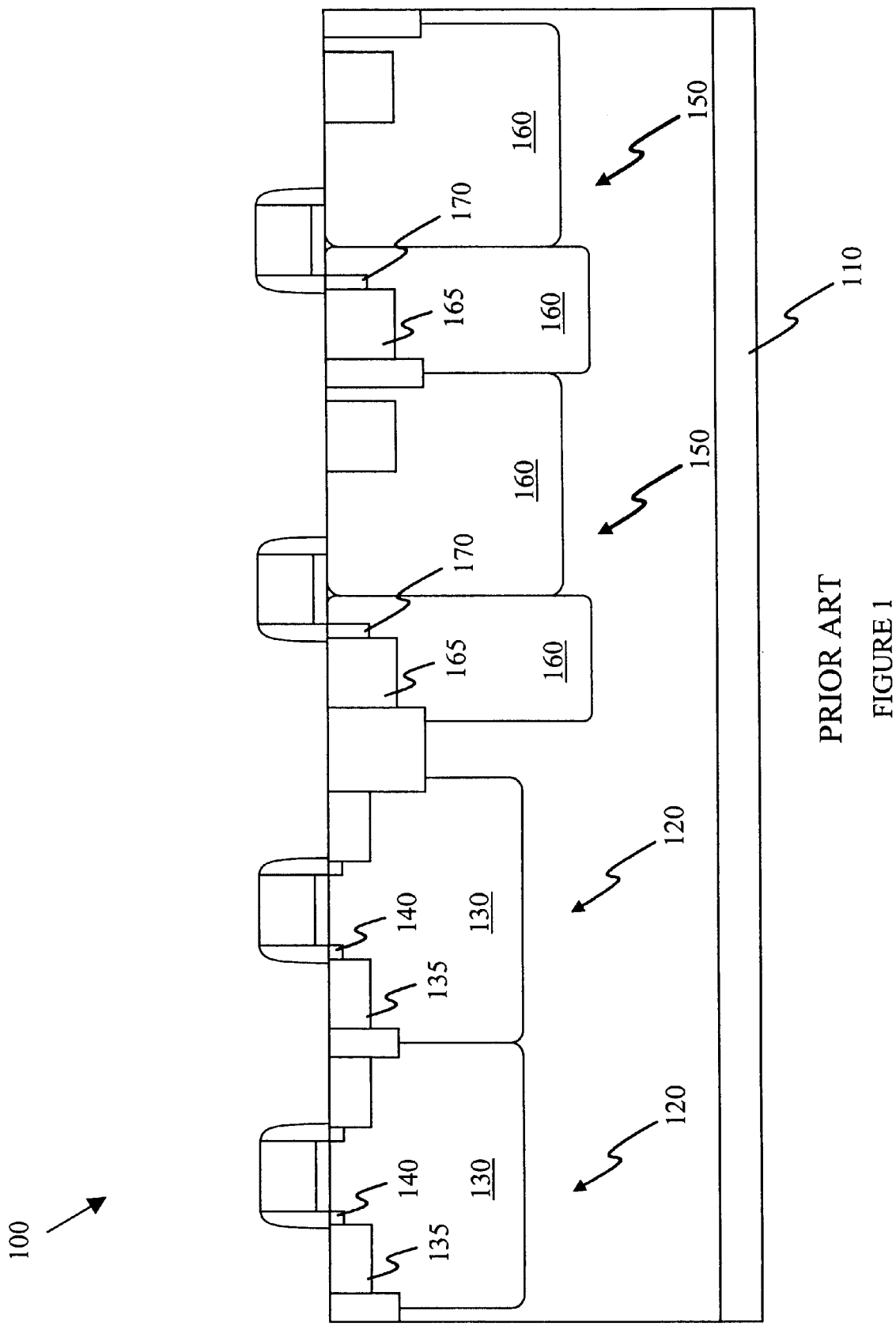
FIG. 1 illustrates a cross-sectional view of a conventional integrated circuit having both CMOS devices and LDMOS devices on a single semiconductor substrate.
Figure 2:
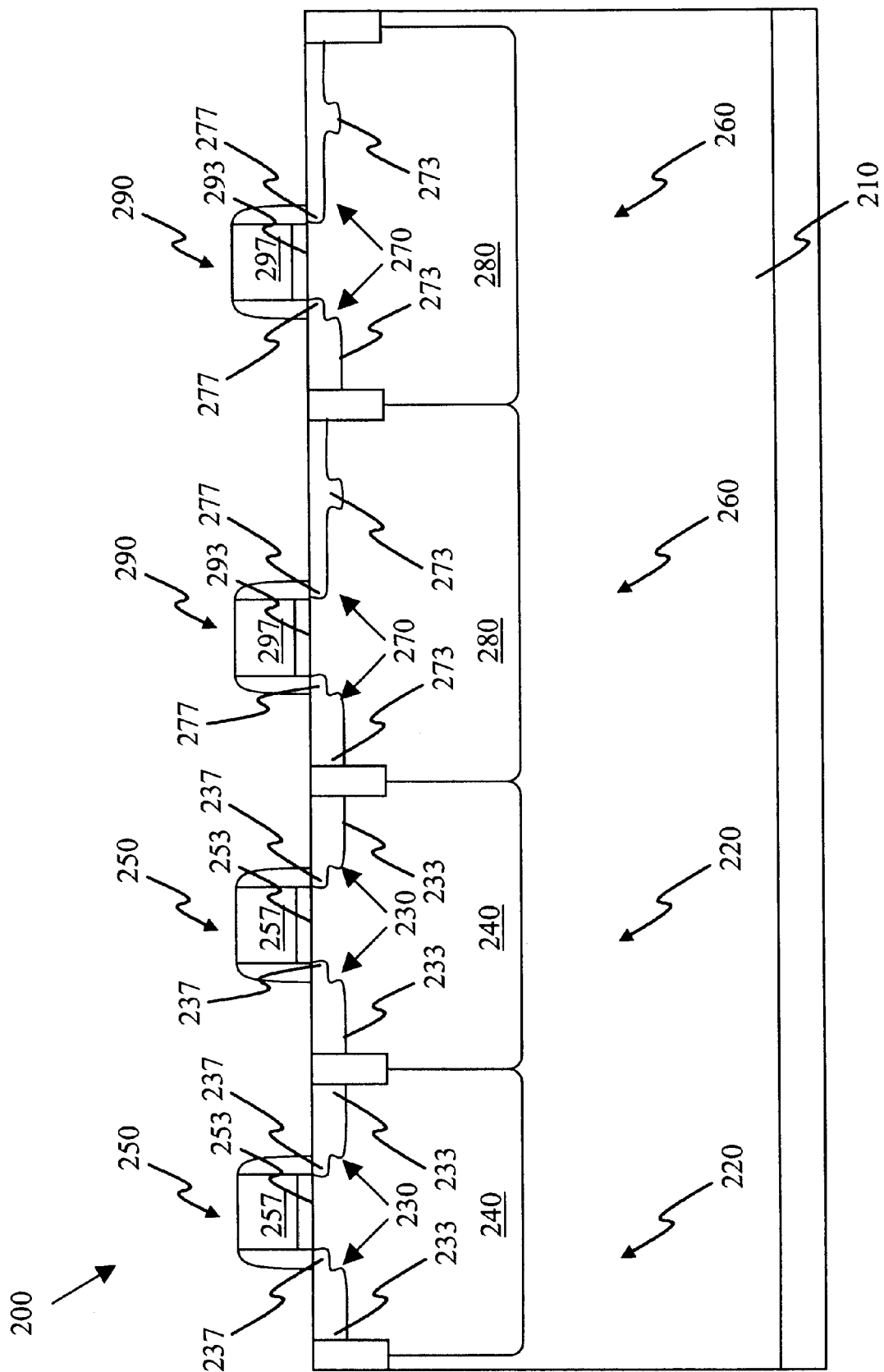
FIG. 2 illustrates a cross-sectional view of an embodiment of a completed semiconductor device constructed according to the principles of the present invention.

Referring initially to FIG. 2, illustrated is a cross-sectional view of one embodiment of a semiconductor device 200 constructed according to the principles of the present invention. In the embodiment illustrated in FIG. 2, the semiconductor device 200 includes a semiconductor substrate 210. Located over the semiconductor substrate 210 are non-power enhanced metal oxide semiconductor (non-PEMOS) devices 220 and power enhanced metal oxide semiconductor (PEMOS) devices 260. The term "non-PEMOS devices" as used herein, refers to any device that is not a PEMOS device and that includes source/drain regions, for example a complementary metal oxide (CMOS) device, bipolar device or another similar device. Additionally, the PEMOS device may comprise a range of devices that are commonly used as power management devices. As is illustrated, the non-PEMOS devices 220 and the PEMOS devices are located proximate one another, and over the same semiconductor substrate 210.

In the illustrative embodiment shown in FIG. 2, the non-PEMOS devices 220, which may comprise CMOS devices, include first source/drain regions 230 located in the semiconductor substrate 210. The first source/drain regions 230 may comprise first heavily doped source/drain regions 233 and first lightly doped source/drain regions 237. The non-PEMOS devices 220 further include non-PEMOS wells 240 formed in the semiconductor substrate 210, and first gate structures 250 formed over the semiconductor substrate 210. In the illustrative embodiment shown in FIG. 2, the first gate structures 250 comprise first gate oxides 253 and first gate electrodes 257.

Each of the previously mentioned features of the non-PEMOS devices 220 may have predetermined properties. For example, the first source/drain regions 230 may have a specific dopant type and a first dopant profile. As used herein, and for the remainder of the document, the term "dopant profile" refers to dopant concentration as a function of dopant depth. Additionally, the first heavily doped regions 233 and first lightly doped regions 237 may have predetermined dopant types and dopant profiles.

As with the first source/drain regions 230, the non-PEMOS wells 240 may have predetermined well dopant types and well dopant profiles. Likewise, the first gate structures 250 have predetermined parameters, including predetermined thicknesses and material type for the first gate oxides 253 and first gate electrodes 257. As one skilled in the art already knows, the various other elements included within the non-PEMOS devices 220, whether previously mentioned or not, have predetermined parameters.

As compared to the non-PEMOS devices 220, the PEMOS devices 260 include second source/drain regions 270 located within the semiconductor substrate 210. The second source/drain regions 270 may include second heavily doped source/drain regions 273 and second lightly doped source/drain regions 277. The PEMOS devices 260 may further include PEMOS wells 280 and second gate structures 290. In the embodiment illustrated in FIG. 2, the second gate structures 290 may include second gate oxides 293 and second gate electrodes 297.

It has been found that the non-PEMOS devices 220 and the PEMOS devices 260 may share elements having similar predetermined properties, without substantially affecting the usefulness of either device. More precisely, it has been found that the PEMOS devices 260 may be manufactured having predetermined properties similar to those typically associated with the non-PEMOS devices 220, e.g., similar to CMOS devices. Using the semiconductor device 200 illustrated in FIG. 2, or another similar device that is constructed according to the principles of the present invention, blocking voltages up to about 80 volts may be obtained. It should be noted that it was originally thought that it was mathematically improbable for the PEMOS devices 260 to be able to share properties with the non-PEMOS devices 220. This is because one-dimensional calculations of PEMOS devices 220 using non-PEMOS feature parameters provide blocking voltages for N-type PEMOS devices of only about 6 volts and blocking voltages for P-type PEMOS devices of only about 4 volts. These are substantially less that the voltages that are desired today, namely, voltages greater than about 8 volts. For this reason, it was not obvious to share feature parameters.

In the illustrative embodiment shown in FIG. 2, the first source/drain regions 230 have the first dopant profile and the second source/drain regions 270 also include the first dopant profile. This may be noticed by comparing the shape of the first source/drain regions 230 to the shape of the second source/drain regions 270. In an alternative embodiment, however, only the first heavily doped source/drain regions 233 and the second heavily doped source/drain regions 273, or only the first lightly doped source/drain regions 237 and second lightly doped source/drain regions 277, have similar dopant profiles.

As also illustrated in the embodiment shown in FIG. 2, the non-PEMOS wells 240 may have the previously mentioned well dopant profile and the PEMOS wells 280 may have the same well dopant profile. Additionally, the first gate structure 250 may have similar properties, e.g., same composition and thickness, as the second gate structure 290. In the illustrative embodiment, the first gate oxide 253 has a predetermined thickness and composition, and the second gate oxide 293 has the same predetermined thickness and composition.

While it has been discussed above that certain features of the non-PEMOS devices 220 and the PEMOS devices 260 may have similar properties, for the scope of the present invention, it is only important that the non-PEMOS devices 220 and the PEMOS devices 260 share a property of at least one feature. Thus, as long as at least one feature of each of the devices 220, 260, has similar properties, any combination of features that are shared, will work.

Because the non-PEMOS devices 220 and PEMOS devices 260 share at least one feature's properties, the non-PEMOS devices 220 and PEMOS devices 260 may share at least one predetermined manufacturing step. As a result, a substantial amount of time and manufacturing cost may be saved during manufacture thereof. For example, where the prior art integrated devices required up to an additional 15 steps to manufacture their LDMOS over forming a traditional CMOS, the present invention may manufacture the non-PEMOS and PEMOS devices 220, 260 sharing substantially all the manufacturing steps. This represents a substantial savings of both time and money, which are both valuable commodities in the microelectronics industry.

Figure 3:
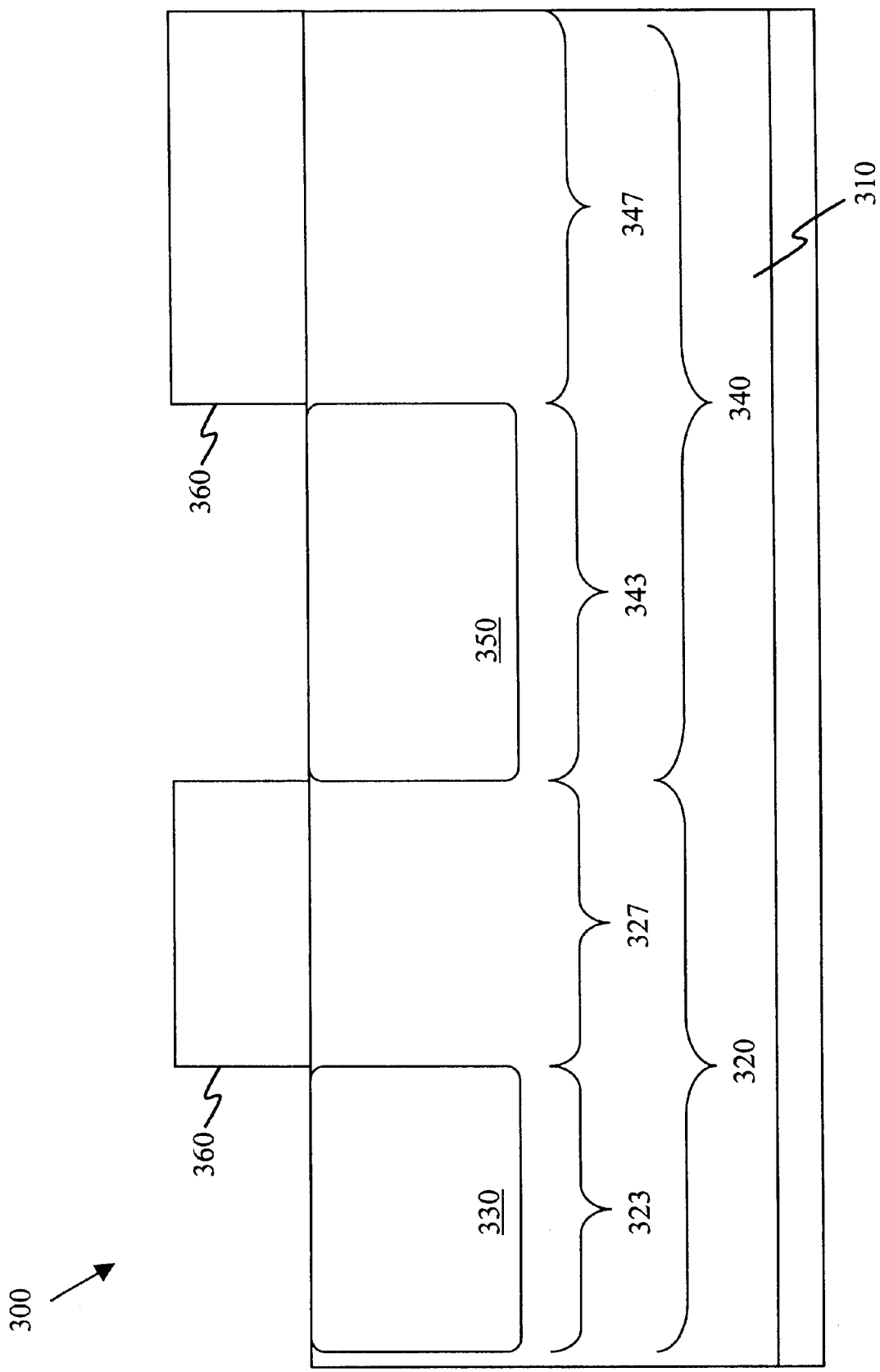
FIG. 3 illustrates a cross-sectional view of an embodiment of a partially completed semiconductor device constructed according to the principles of the present invention.

Turning to FIGS. 3–12, illustrated are cross-sectional views of detailed manufacturing steps instructing how one might, in an advantageous embodiment, manufacture a semiconductor device similar to the semiconductor device 200 depicted in FIG. 2. FIG. 3 illustrates a cross-sectional view of a partially completed semiconductor device 300. The partially completed semiconductor device 300 includes a semiconductor substrate 310. The semiconductor substrate 310 may, in an exemplary embodiment, be any layer located in the partially completed semiconductor device 300, including a wafer itself or a layer located above the wafer (e.g., epitaxial layer). In the embodiment illustrated in FIG. 3, the semiconductor substrate 310 is a P-type substrate; however, one skilled in the art understands that the semiconductor substrate 310 could be an N-type substrate, without departing from the scope of the present invention.

The embodiment of the partially completed semiconductor device 300 illustrated in FIG. 3, includes two device regions. The two device regions consist of a non-PEMOS device region 320 and a PEMOS device region 340. In the illustrative embodiment shown in FIG. 3, the non-PEMOS device region 320 can further be broken into an N-type non-PEMOS device region 323 and a P-type non-PEMOS device region 327. Additionally, the PEMOS device region 340 may be broken into an N-type PEMOS device region 343 and a P-type PEMOS device region 347. One skilled in the art understands that the dopant type substantially affects whether a device is an N-type or P-type device.

Simultaneously formed within the semiconductor substrate 310 in the N-type non-PEMOS device region 323 and the N-type PEMOS device 343 are an N-type non-PEMOS well 330 and an N-type PEMOS well 350, respectively. In the illustrative embodiment, the N-type non-PEMOS well 330 and the N-type PEMOS well 350 have a similar dopant profile. For example, in one embodiment of the invention, the N-type non-PEMOS well 330 and the N-type PEMOS well 350 have a peak dopant concentration ranging from about 1E16 atoms/cm$^3$ to about 1E18 atoms/cm$^3$, and more preferably about 5E16 atoms/cm$^3$. Additionally, the N-type non-PEMOS well 330 and the N-type PEMOS well 350 may have similar depths and dopant types.

A more detailed explanation of an exemplary method of forming the N-type non-PEMOS well 330 and the N-type PEMOS well 350 will hereafter be described. For example, the N-type non-PEMOS well 330 and the N-type PEMOS well 350 are formed by blanket depositing a layer of photoresist over the surface of the semiconductor substrate 310, patterning and developing the layer of photoresist forming photoresist portions 360, and subsequently subjecting portions of the semiconductor substrate 310 unprotected by the photoresist portions 360, to a desired dopant. The devices may then be subjected to an annealing step designed to drive the dopants to a desired depth. The width of the N-type non-PEMOS well 330 and the N-type PEMOS well 350 may be very important, and as one skilled in the art already knows, may be controlled by the photoresist portions 360 above. As illustrated, the width of the N-type non-PEMOS well 330 and the N-type PEMOS well 350 may be different from one another without departing from the scope of the present invention.

Figure 4:
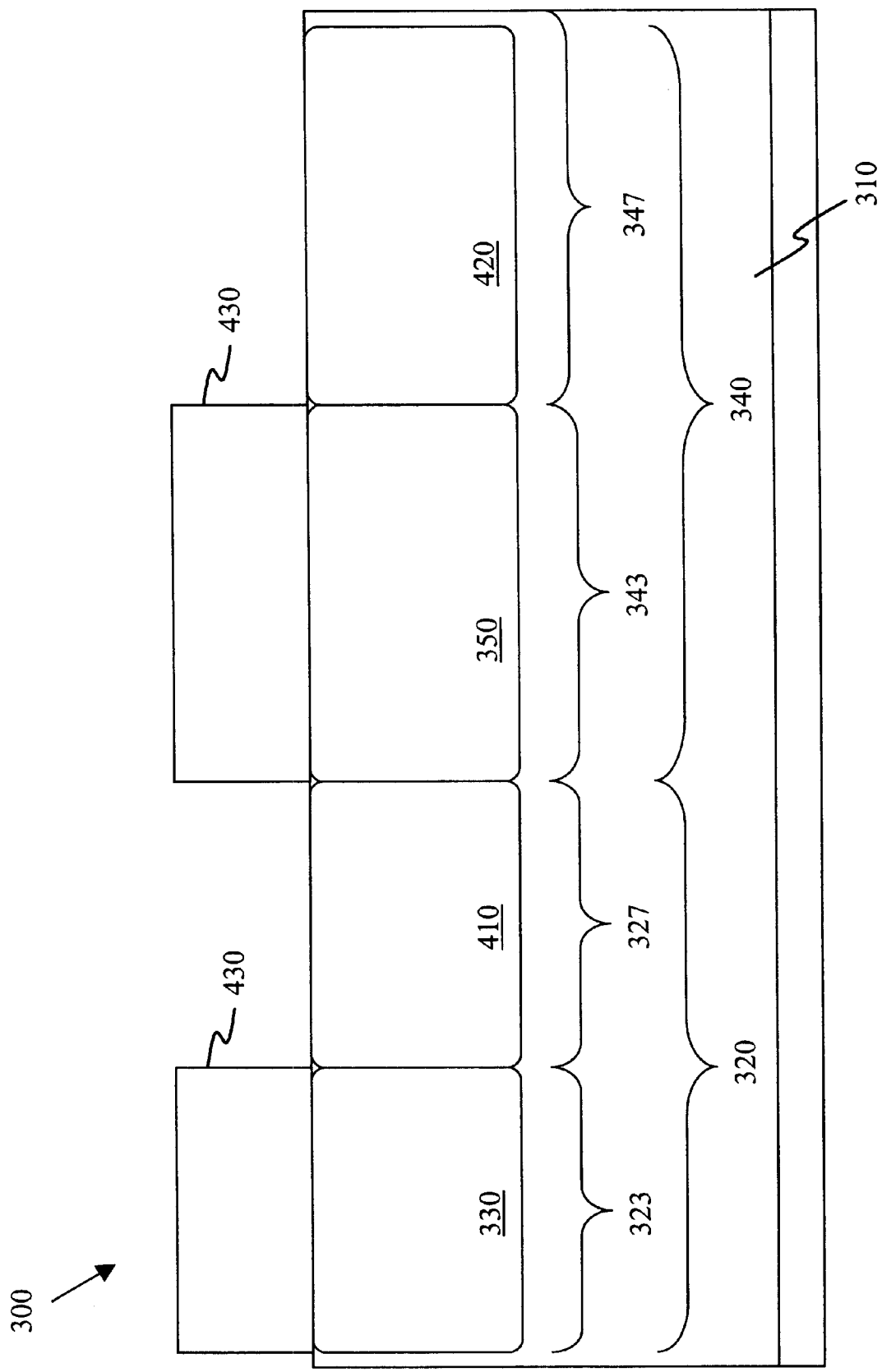
FIG. 4 illustrates a cross-sectional view of the partially completed semiconductor device illustrated in FIG. 3, after formation of a P-type non-PEMOS well within a P-type non-PEMOS device region, and a P-type PEMOS well within a P-type PEMOS device region.

Turning to FIG. 4, illustrated is a cross-sectional view of the partially completed semiconductor device 300 illustrated in FIG. 3, after formation of a P-type non-PEMOS well 410 within the P-type non-PEMOS device region 327, and a P-type PEMOS well 420 within the P-type PEMOS device region 347. In the illustrative embodiment shown in FIG. 4, the P-type non-PEMOS well 410 and the P-type PEMOS well 420 are simultaneously formed, therefore, such wells have a substantially similar dopant type and dopant profile. In one advantageous embodiment of the invention, the P-type non-PEMOS well 410 and the P-type PEMOS well 420 have a peak dopant concentration ranging from about 1E16 atoms/cm$^3$ to about 1E18 atoms/cm$^3$, and more preferably about 5E16 atoms/cm$^3$. Additionally, the P-type non-PEMOS well 410 and the P-type PEMOS well 420 may be doped with boron, among other things.

One skilled in the art understands how to form the P-type non-PEMOS well 410 and the P-type PEMOS well 420. Similar steps as used to form the N-type non-PEMOS well 330 and the N-type PEMOS well 350 above may be used to form the P-type non-PEMOS well 410 and the P-type PEMOS well 420. This includes using photoresist portions 430 to define the wells 410, 420. As mentioned above, the width of the P-type non-PEMOS well 410 and the P-type PEMOS well 420 may be very important, and may be controlled by the photoresist portions 430 discussed above. As also illustrated, the width of the P-type non-PEMOS well 410 and the P-type PEMOS well 420 may be different from one another without departing from the scope of the present invention.

Figure 5:
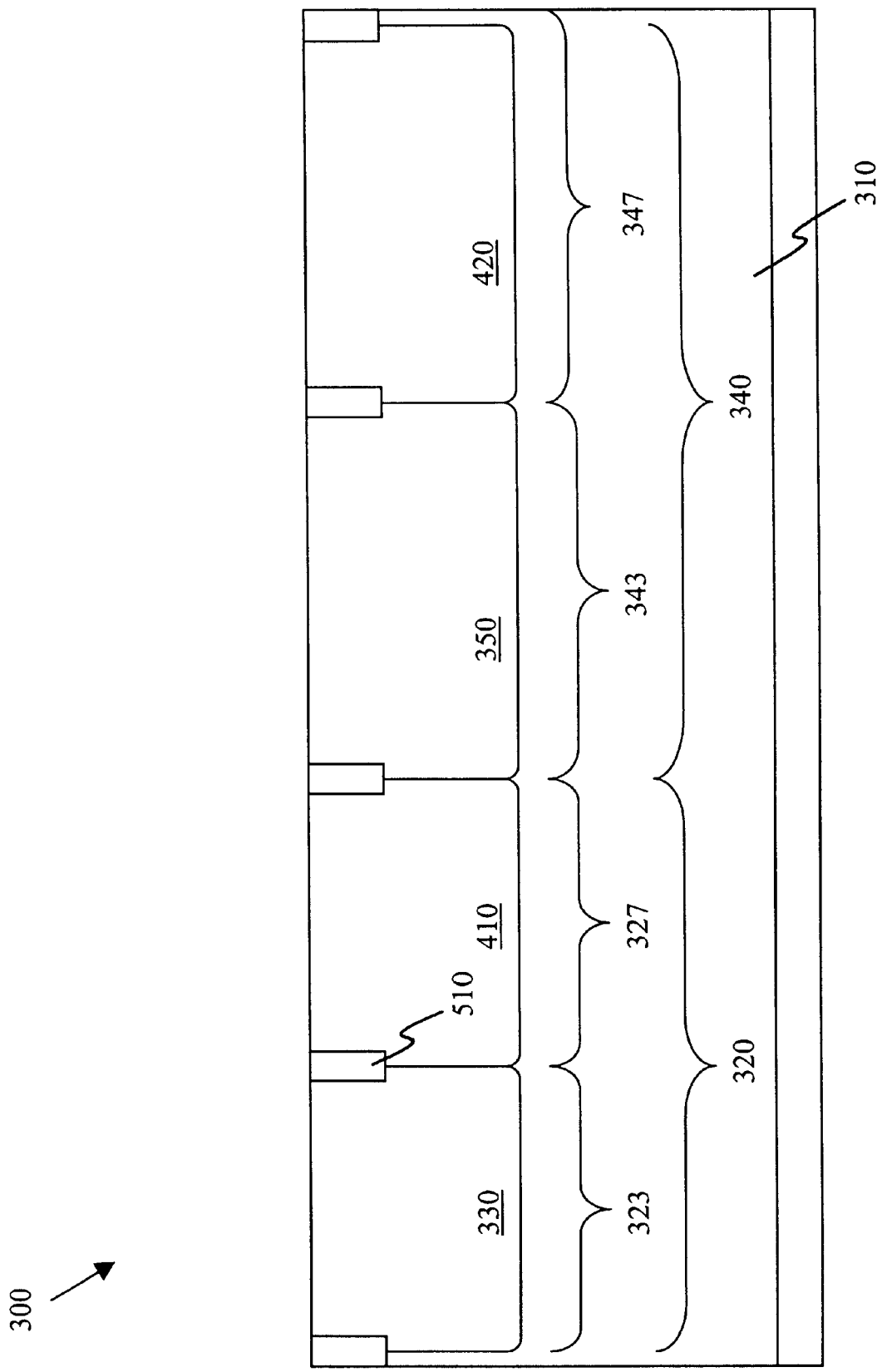
FIG. 5 illustrates a cross-sectional view of the partially completed semiconductor device illustrated in FIG. 4, after formation of conventional isolation structures.

Turning to FIG. 5, illustrated is a cross-sectional view of the partially completed semiconductor device 300 illustrated in FIG. 4, after formation of field oxides 510. While field oxides 510 have been shown in FIG. 5, one skilled in the art understands that other similar isolation regions may be used without departing from the scope of the present invention.

Figure 6:
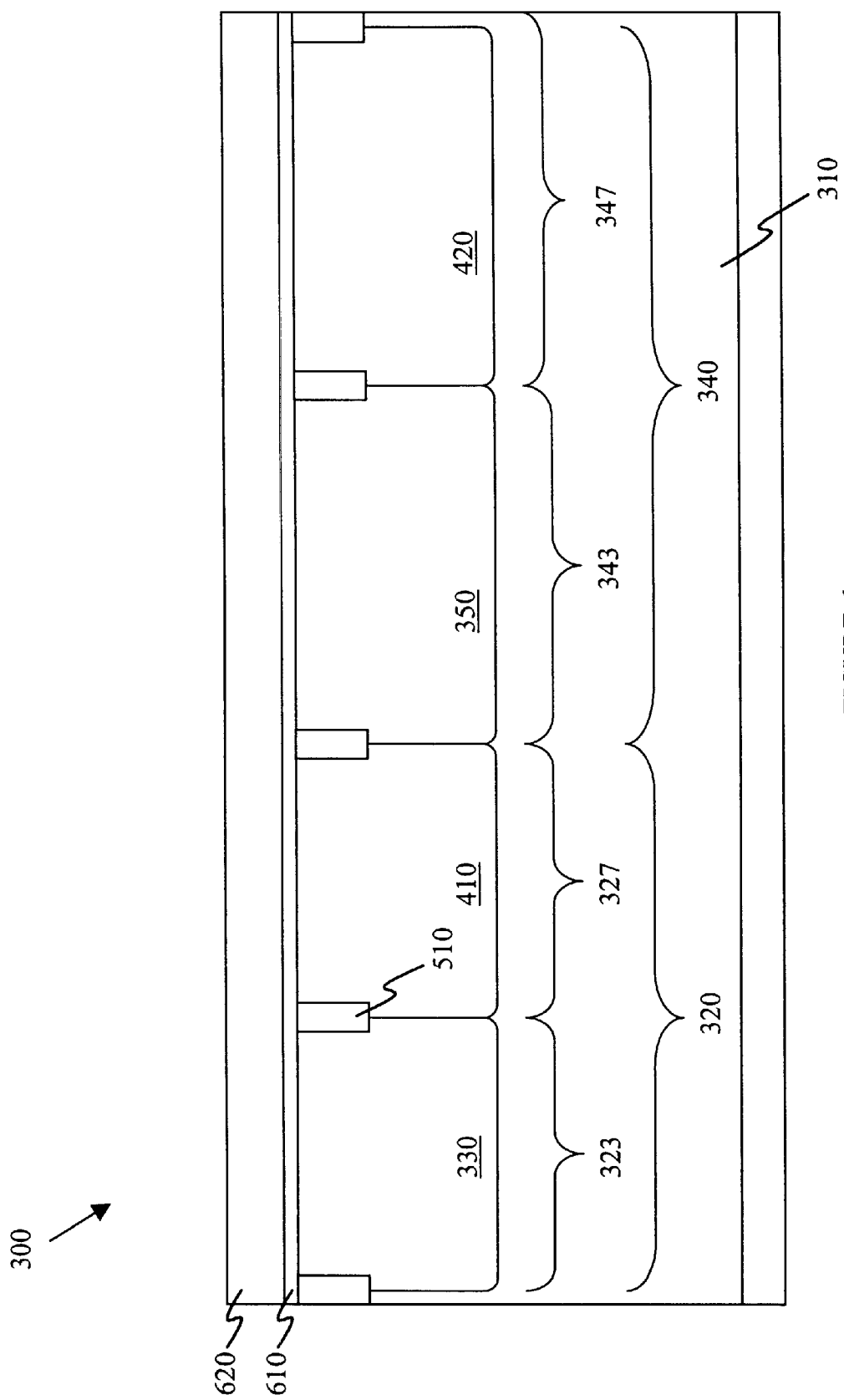
FIG. 6 illustrates a cross-sectional view of the partially completed semiconductor device illustrated in FIG. 5, after formation of a gate oxide layer and gate electrode layer.

Turning now to FIG. 6, illustrated is a cross-sectional view of the partially completed semiconductor device 300 illustrated in FIG. 5, after formation of a gate oxide layer 610 and gate electrode layer 620. The gate oxide layer 610 may comprise many materials including silicon dioxide, a high dielectric constant material, or another similar material. Additionally, the gate oxide layer 610 may be formed having various thicknesses. In the illustrative embodiment shown in FIG. 6, the gate oxide layer 610 is formed to a thickness ranging from about 5 nm to about 100 nm, and more preferably to a thickness of about 12 nm.

The gate electrode layer 620 may also comprise a wide range of materials including various metals, doped semiconductors, or other conductive materials. Additionally, the gate electrode layer 620 may have a wide range of thicknesses. Such thicknesses generally range from about 100 nm to about 1000 nm, however, other thicknesses are within the scope of the present invention.

Both the gate oxide layer 610 and gate electrode layer 620 are typically formed using conventional processes. Such conventional processes may include, but are not limited to, chemical vapor deposition (CVD), physical vapor deposition (PVD), epitaxial growth, or other similar processes.

Figure 7:
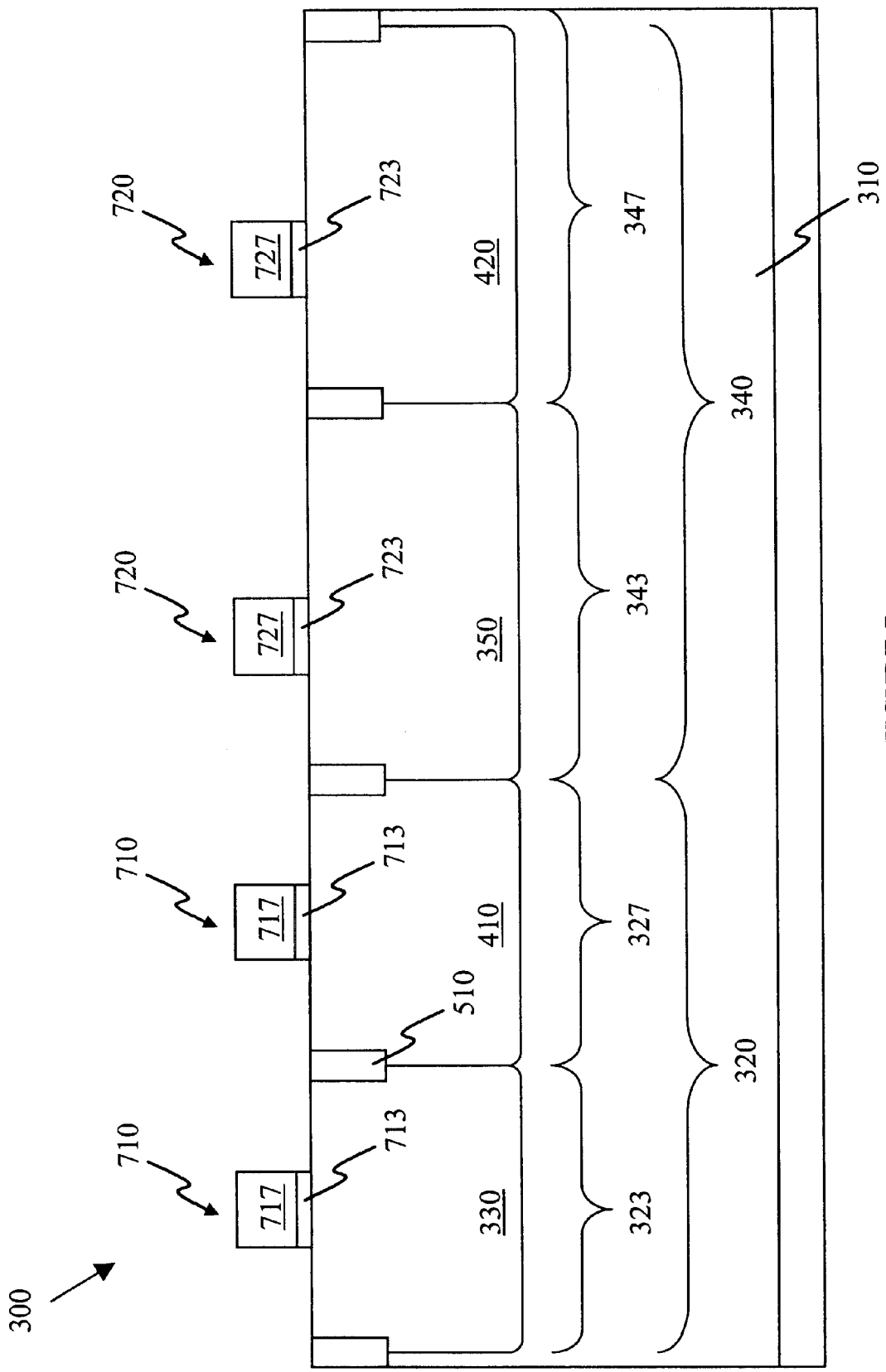
FIG. 7 illustrates a cross-sectional view of the partially completed semiconductor device illustrated in FIG. 6, after patterning the gate oxide layer and gate electrode layer to form first gate structures and second gate structures.

Turning to FIG. 7, illustrates a cross-sectional view of the partially completed semiconductor device 300 illustrated in FIG. 6, after patterning the gate oxide layer 610 and gate electrode layer 620 to form first gate structures 710 (e.g., non-PEMOS device gate structures) and second gate structures 720 (e.g., PEMOS device gate structures). As illustrated, the first gate structures 710 may include first gate oxides 713 and first gate electrodes 717. Additionally, the second gate structures 720 may include second gate oxides 723 and second gate structures 727. Since the gate oxides 713, 723 and gate electrodes 717, 727, were formed simultaneously during the embodiment described in FIG. 7, the gate oxides 713, 723 and gate electrodes 717, 727 may have similar thicknesses and material compositions, respectively. It should be noted, however, this is not always the case. One skilled in the art understands how to define a gate structure, including using photoresist and etches, and consequently, no further discussion is warranted.

Figure 8:
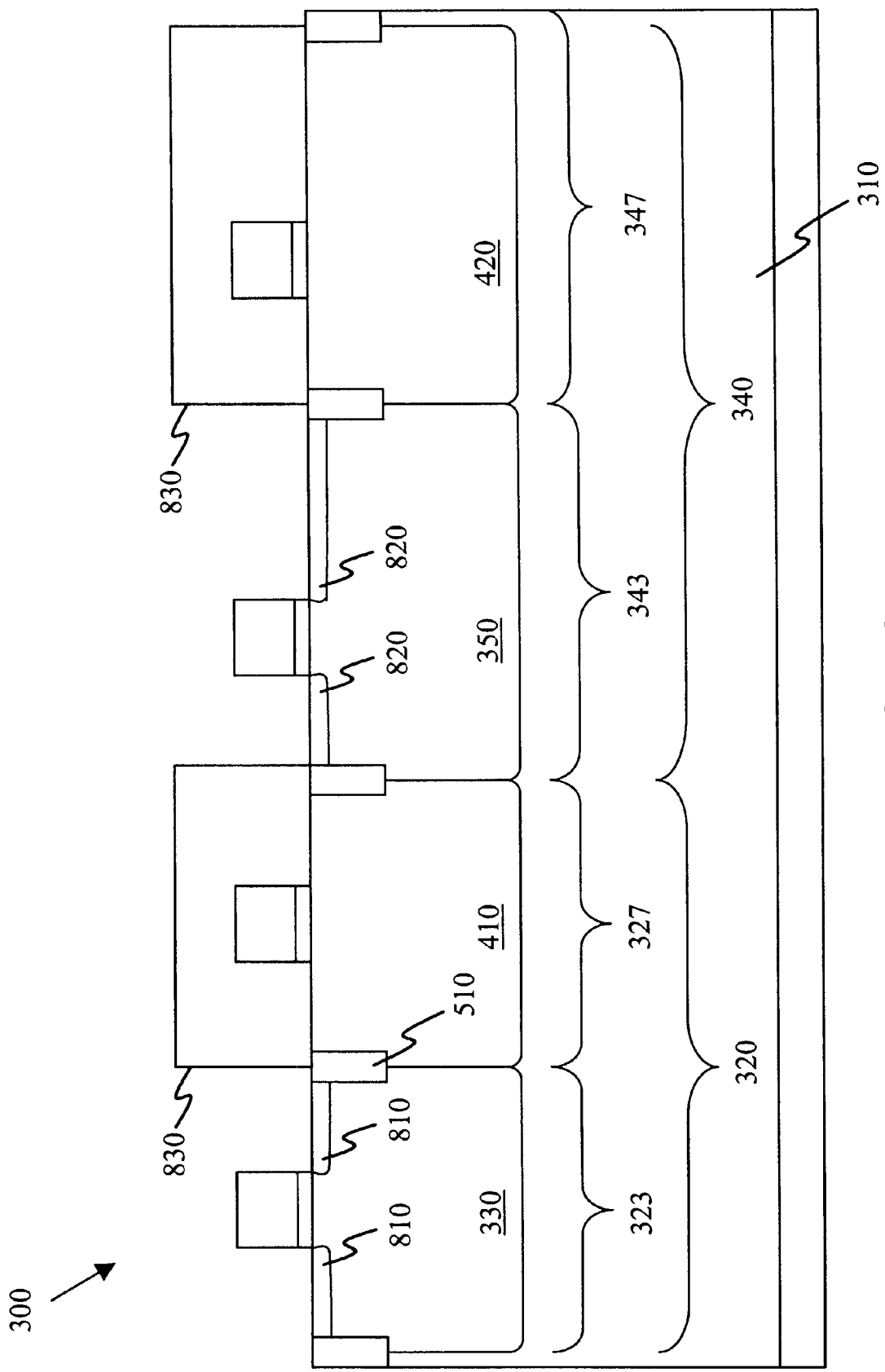
FIG. 8 illustrates a cross-sectional view of the partially completed semiconductor device illustrated in FIG. 7, after formation of P-type first lightly doped source/drain regions within the N-type non-PEMOS well, and P-type second lightly doped source/drain regions within the N-type PEMOS well.

Turning to FIG. 8, illustrated is a cross-sectional view of the partially completed semiconductor device 300 illustrated in FIG. 7, after formation of P-type first lightly doped source/drain regions 810 within the N-type non-PEMOS well 330, and P-type second lightly doped source/drain regions 820 within the N-type PEMOS well 350. The P-type first lightly doped source/drain regions 810 and the P-type second lightly doped source/drain regions 820 may be formed using any known or hereafter discovered process. In one embodiment of the present invention, a layer of photoresist is blanket deposited over the semiconductor substrate 310, the photoresist layer is patterned and developed leaving photoresist portions 830, and portions of the semiconductor substrate 310 left unprotected by the photoresist portions 830 are subjected to a dopant. A width of the P-type second lightly doped source/drain regions 820 may be altered to control voltage characteristics associated with the N-type PEMOS device region 343. One skilled in the art understands how to alter the width of the P-type second lightly doped source/drain regions 820.

Because of the nature of manufacturing the P-type first lightly doped source/drain regions 810 and the P-type second lightly doped source/drain regions 820, a P-type lightly doped source/drain dopant profile will be shared by the two. It should be noted, however, that if a different P-type lightly doped source/drain dopant profile is desired for the P-type first lightly doped source/drain regions 810 and the P-type second lightly doped source/drain regions 820, then one area could be masked off while the other area is being formed, and vice versa.

In the exemplary embodiment shown in FIG. 8, the P-type lightly doped source/drain dopant profile has a peak dopant concentration ranging from about 2E17 atoms/cm$^3$ to about 2E19 atoms/cm$^3$, and more preferably of about 3E18 atoms/cm$^3$. While particular ranges have been given for the exemplary embodiment illustrated in FIG. 8, one skilled in the art understands that any range is within the scope of the present invention.

Figure 9:
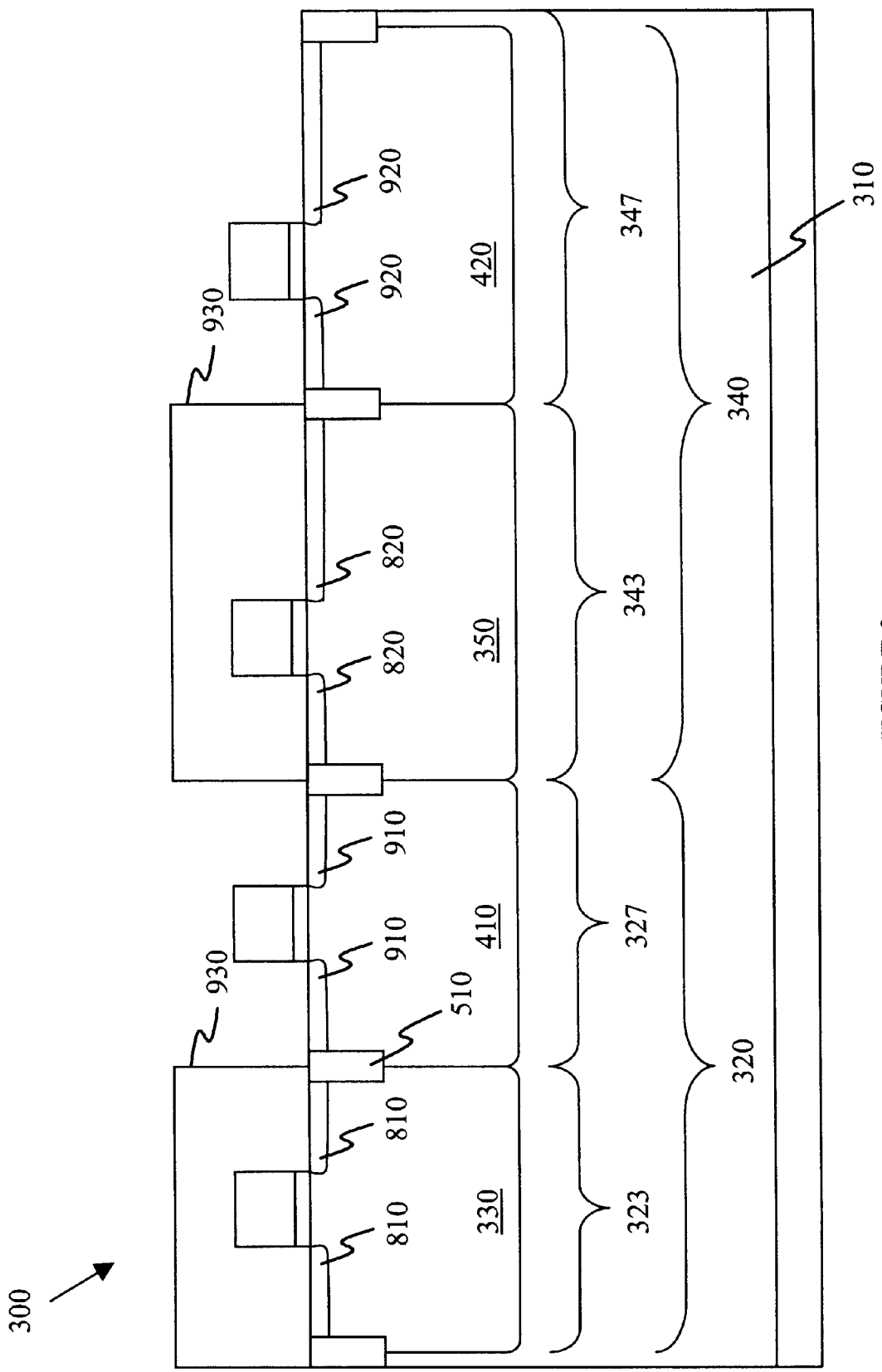
FIG. 9 illustrates a cross-sectional view of the partially completed semiconductor device illustrated in FIG. 8, after formation of N-type first lightly doped source/drain regions within the P-type non-PEMOS well, and N-type second lightly doped source/drain regions within the P-type PEMOS well.

Turning to FIG. 9, illustrated is a cross-sectional view of the partially completed semiconductor device 300 illustrated in FIG. 8, after formation of N-type first lightly doped source/drain regions 910 within the P-type non-PEMOS well 410, and N-type second lightly doped source/drain regions 920 within the P-type PEMOS well 420. As is illustrated, the N-type first lightly doped source/drain regions 910 and the N-type second lightly doped source/drain regions 920 have a similar N-type lightly doped source/drain dopant profile. While, this may not always be the case, it may be particularly useful in saving manufacturing steps. In the embodiment shown in FIG. 9, the N-type lightly doped source/drain dopant profile has a peak concentration ranging from about 2E17 atoms/cm$^3$ to about 2E19 atoms/cm$^3$, and more preferably of about 2E18 atoms/cm$^3$. It should be noted, however, that these ranges may vary from those just mentioned without departing from the scope of the present invention.

The N-type first lightly doped source/drain regions 910 and the N-type second lightly doped source/drain regions 920 may be formed using a similar process to that used to form the P-type first lightly doped source/drain regions 810 and the P-type second lightly doped source/drain regions 820. This includes blanket depositing a layer of photoresist, patterning and developing the layer of photoresist forming photoresist portions 930, and subjecting the unprotected portions to a dopant. A width of the N-type second lightly doped source/drain regions 920 may be altered to control voltage characteristics associated with the P-type PEMOS device region 347. One skilled in the art understands how to alter the width of the N-type second lightly doped source/drain regions 920. Additionally, while many details of the manufacturing process have been omitted, one skilled in the art understands that such details are well known in the art.

Figure 10:
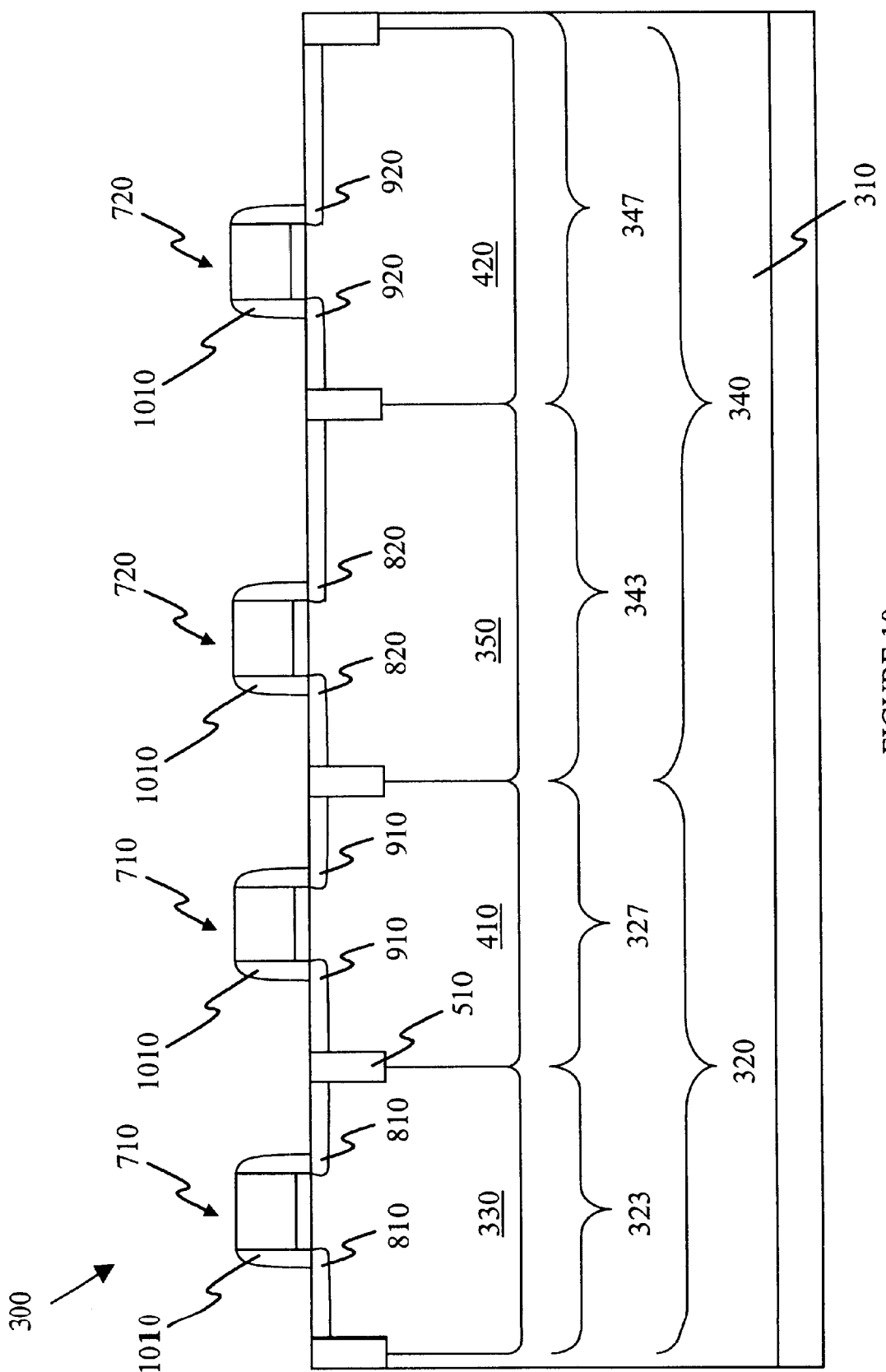
FIG. 10 illustrates a cross-sectional view of the partially completed semiconductor device illustrated in FIG. 9, after formation of gate sidewall spacers.

Turning to FIG. 10, illustrated is a cross-sectional view of the partially completed semiconductor device 300 illustrated in FIG. 9, after formation of gate sidewall spacers 1010. The gate sidewall spacers 1010, which may comprise an oxide, are generally formed by blanket depositing a layer of oxide over the surface of the semiconductor substrate 310, and anisotropically etching the layer of oxide, resulting in the gate sidewall spacers 1010.

Figure 11:
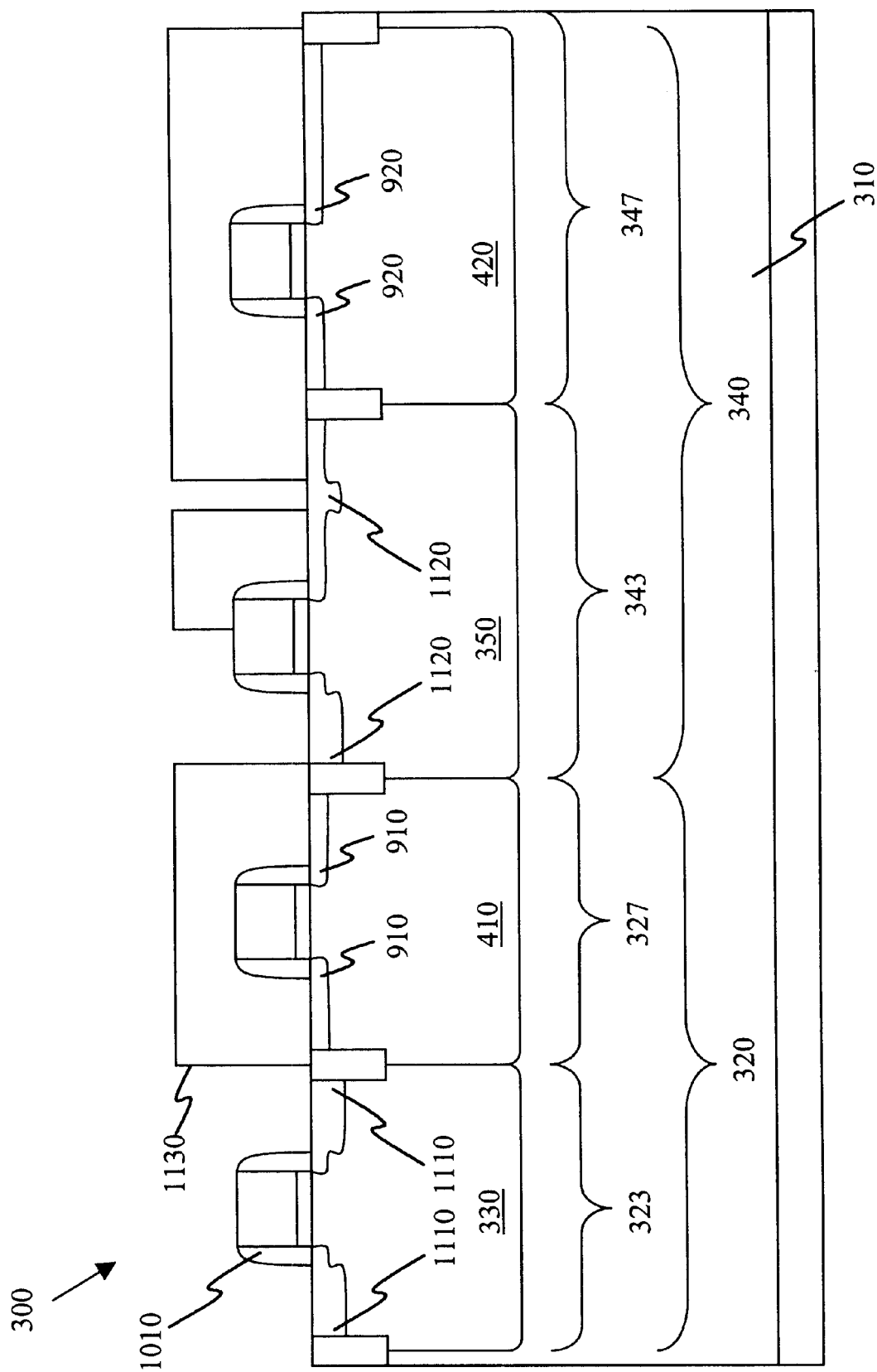
FIG. 11 illustrates a cross-sectional view of the partially completed semiconductor device illustrated in FIG. 10, after formation of P-type first heavily doped source/drain regions within the N-type non-PEMOS well, and P-type second heavily doped source/drain regions within the N-type PEMOS well.

Turning to FIG. 11, illustrated is a cross-sectional view of the partially completed semiconductor device 300 illustrated in FIG. 10, after formation of P-type first heavily doped source/drain regions 1110 within the N-type non-PEMOS well 330, and P-type second heavily doped source/drain regions 1120 within the N-type PEMOS well 350. The P-type first heavily doped source/drain regions 1110 and the P-type second heavily doped source/drain regions 1120 may be formed using a similar process as used above to form the P-type first lightly doped source/drain regions 810 and the P-type second lightly doped source/drain regions 820. This includes using the gate sidewall spacer 1010 and photoresist portions 1130 to define the P-type first heavily doped source/drain regions 1110 and the P-type second heavily doped source/drain regions 1120.

As illustrated, the P-type first heavily doped source/drain regions 1110 and the P-type second heavily doped source/drain regions 1120 may have a similar P-type heavily doped source/drain dopant profile. In one example, the P-type heavily doped source/drain dopant profile has a concentration ranging from about 5E19 atoms/cm$^3$ to about 5E21 atoms/cm$^3$, and more preferably about 2E20 atoms/cm$^3$. Other concentrations, however, are within the scope of the present invention.

Figure 12:
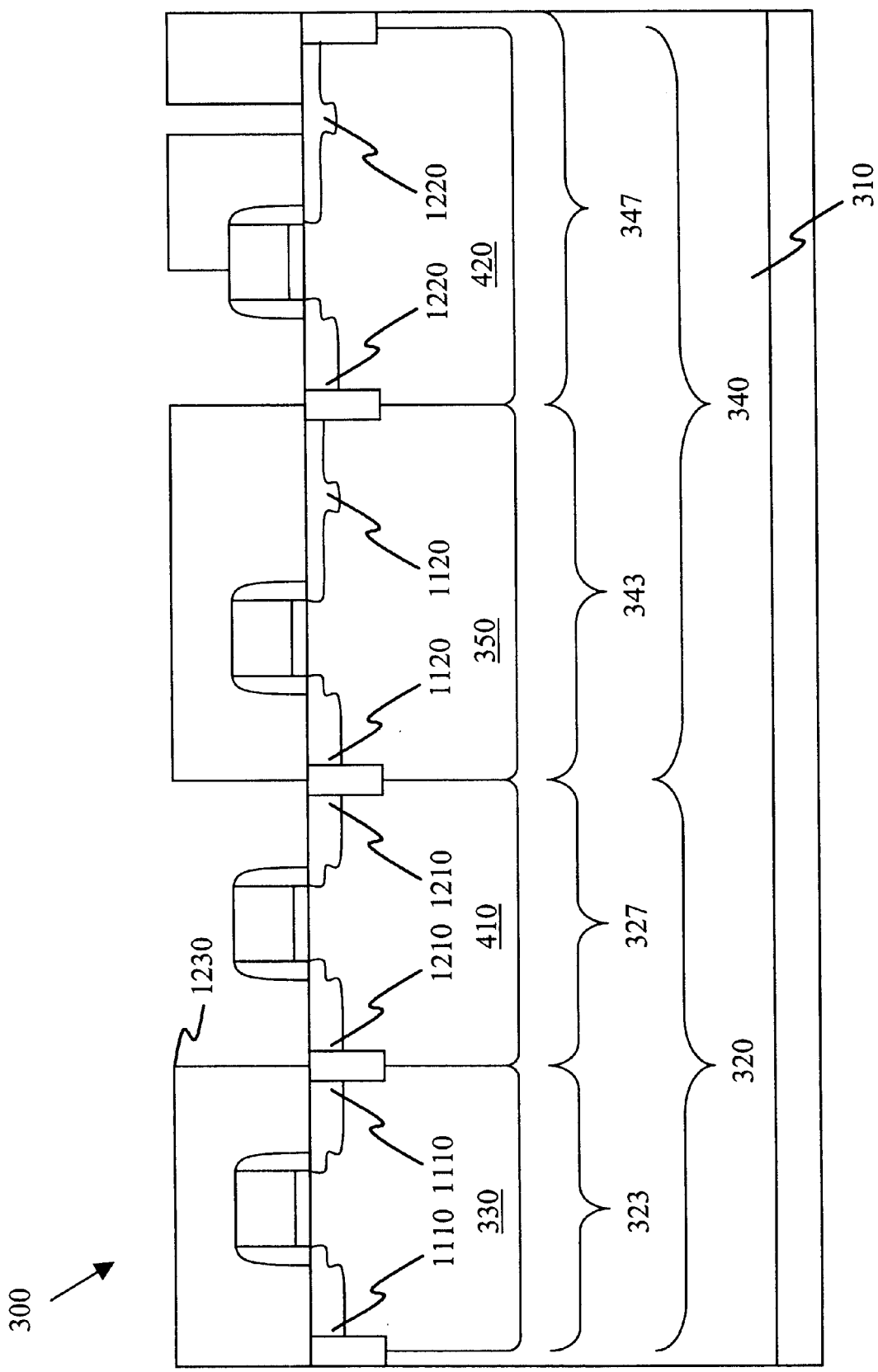
FIG. 12 illustrates a cross-sectional view of the partially completed semiconductor device illustrated in FIG. 11, after formation of N-type first heavily doped source/drain regions within the P-type non-PEMOS well, and N-type second heavily doped source/drain regions within the P-type PEMOS well.

Turning to FIG. 12, illustrated is a cross-sectional view of the partially completed semiconductor device 300 illustrated in FIG. 11, after formation of N-type first heavily doped source/drain regions 1210 within the P-type non-PEMOS well 410, and N-type second heavily doped source/drain regions 1220 within the P-type PEMOS well 420. The N-type first heavily doped source/drain regions 1210 and the N-type second heavily doped source/drain regions 1220 may be formed using a similar process as described above. In an exemplary embodiment, the N-type first heavily doped source/drain regions 1210 and the N-type second heavily doped source/drain regions 1220 have a similar N-type heavily doped source/drain dopant profile. For example, the N-type heavily doped source/drain dopant profile may have a dopant concentration ranging from about 5E19 atoms/cm$^3$ to about 5E21 atoms/cm$^3$, and more preferably of about 2E20 atoms/cm$^3$. Other concentrations, however, are within the scope of the present invention. After forming the N-type first heavily doped source/drain regions 1210 and the N-type second heavily doped source/drain regions 1220, photoresist portions 1230 may be removed, resulting in a device similar to the completed semiconductor device 200 illustrated in FIG. 2.

Figure 13:
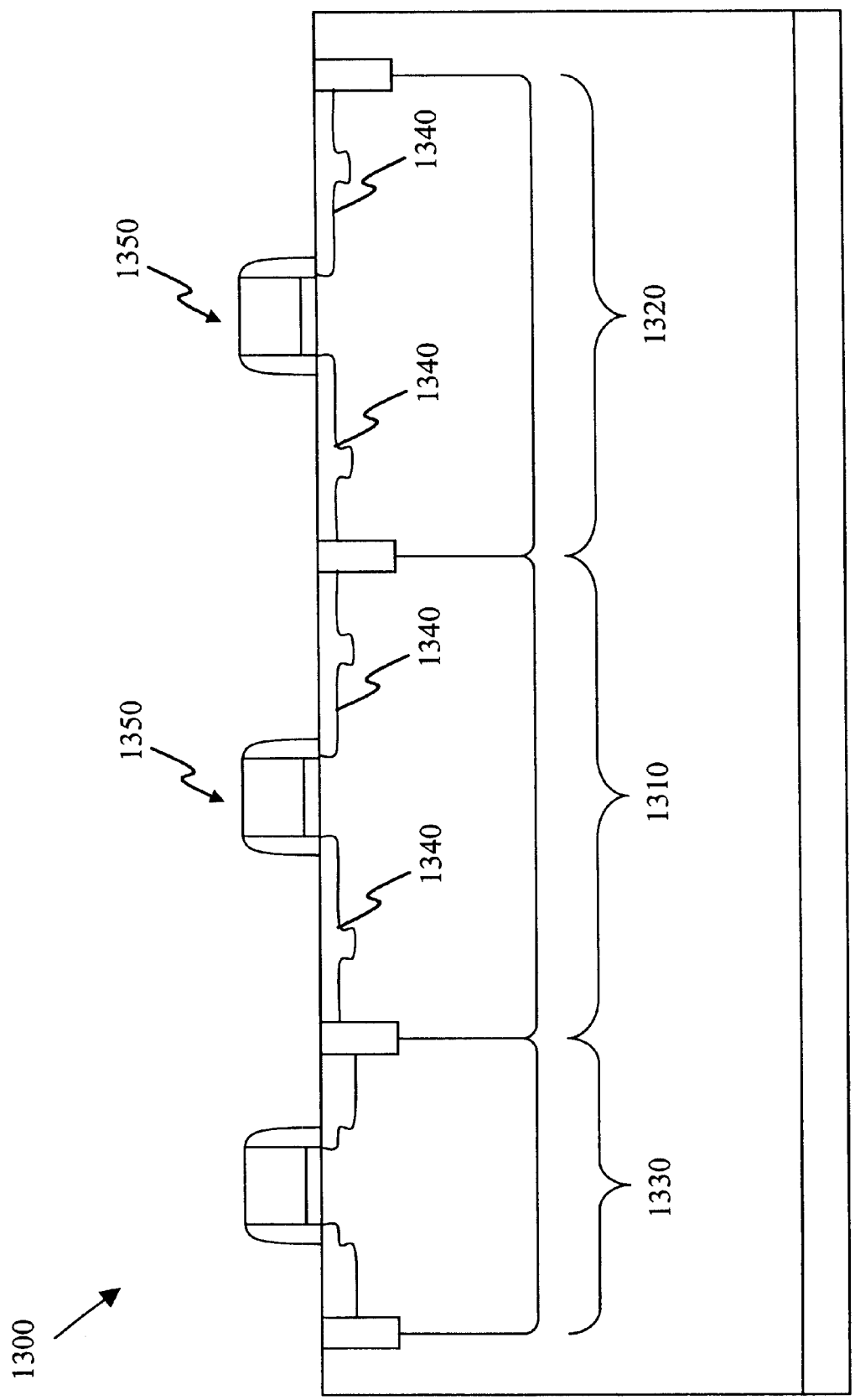
FIG. 13 illustrates a cross-sectional view of an alternative embodiment of the completed semiconductor device constructed according to the principles of the present invention.

Turning to FIG. 13, illustrated is a cross-sectional view of an alternative embodiment of a completed semiconductor device 1300 constructed according to the principles of the present invention. In the embodiment shown in FIG. 13, an N-type PEMOS device 1310 and a P-type PEMOS device 1320, which are located adjacent a non-PEMOS device 1330, are each symmetrical devices. The term symmetrical devices means that similar shaped PEMOS source/drain regions 1340 are located on opposing sides of the PEMOS gate structures 1350. As a result, the N-type PEMOS device 1310 and the P-type PEMOS device 1320 may have operational voltages that float between positive and negative values. Such symmetric devices were unobtainable in the prior art devices.

Figure 14:
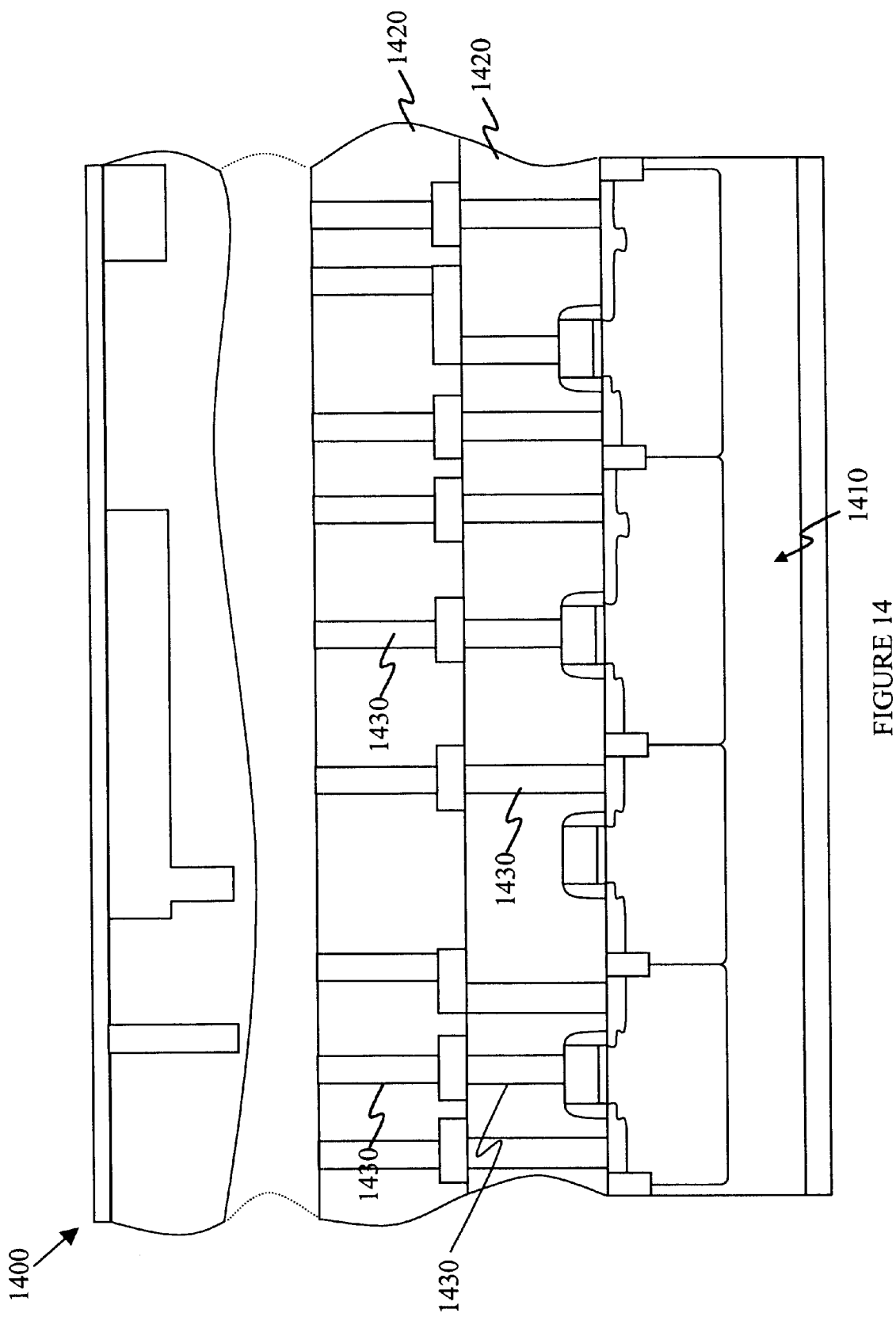
FIG. 14 illustrates a cross-sectional view of an embodiment of a conventional integrated circuit (IC) incorporating a semiconductor device constructed according to the principles of the present invention.

Referring finally to FIG. 14, illustrated is a sectional view of a conventional integrated circuit (IC) 1400 incorporating a semiconductor device 1410 constructed according to the principles of the present invention. The IC 1400 may include devices, such as transistors used to form CMOS devices, BiCMOS devices, Bipolar devices, or other types of devices. The IC 1400 may further include passive devices, such as inductors or resistors, or it may also include optical devices or optoelectronic devices. Those skilled in the art are familiar with these various types of devices and their manufacture. In the particular embodiment illustrated in FIG. 14, the IC 1400 includes the semiconductor device 1410 having dielectric layers 1420 located thereover. Additionally, interconnect structures 1430 are located within the dielectric layer 1420 to interconnect various devices, thus, forming the operational integrated circuit 1400.

Although the present invention has been described in detail, those skilled in the art should understand that they can make various changes, substitutions and alterations herein without departing from the spirit and scope of the invention in its broadest form.

What is claimed is:

1. A semiconductor device, comprising:

a non-power enhanced metal oxide semiconductor (non-PEMOS) device having first source/drain regions located in a semiconductor substrate, wherein the first source/drain regions include a first dopant profile, and wherein the non-PEMOS device has a first gate oxide having a thickness; and a power enhanced metal oxide semiconductor (PEMOS) device located adjacent the non-PEMOS device and having second source/drain regions located in the semiconductor substrate, wherein the second source/drain regions include the first dopant profile, and wherein the PEMOS device has a second gate oxide having the thickness.

2. The semiconductor device as recited in claim 1 wherein the first source/drain regions are first heavily doped source/drain regions and the second source/drain regions are second heavily doped source/drain regions.

3. The semiconductor device as recited in claim 2 wherein the first dopant profile has a peak dopant concentration ranging from about 5E19 atoms/cm$^3$ to about 5E21 atoms/cm$^3$.

4. The semiconductor device as recited in claim 1 wherein the non-PEMOS device includes first lightly doped source/drain regions having a second dopant profile and the PEMOS device includes second lightly doped source/drain regions having the second dopant profile.

5. The semiconductor device as recited in claim 4 wherein the second dopant profile has a peak dopant concentration ranging from about 2E17 atoms/cm$^3$ to about 2E19 atoms/cm$^3$.

6. The semiconductor device as recited in claim 1 wherein the first source/drain regions are located within a non-PEMOS well having a well dopant profile and the second source/drain regions are located within a PEMOS well having the well dopant profile.

7. The semiconductor device as recited in claim 6 wherein the well dopant profile has a peak dopant concentration ranging from about 1E16 atoms/cm$^3$ to about 1E18 atoms/cm$^3$.

8. The semiconductor device as recited in claim 1 wherein the thickness ranges from about 5 nm to about 100 nm.

9. The semiconductor device as recited in claim 1 wherein the PEMOS device is a symmetric PEMOS device having similar second source/drain regions located on opposing sides of a PEMOS gate structure.

* * * * *